United States Patent [19]

Chen

[11] Patent Number: 5,305,182
[45] Date of Patent: Apr. 19, 1994

[54] READ/WRITE UNIT FOR TWO INTEGRATED CIRCUIT CARDS

[76] Inventor: Teng-Ka Chen, No. 302, Chang-Hsing Road, Pa-Teh Hsiang Tao-Yunn Hsien, Taiwan

[21] Appl. No.: 960,804

[22] Filed: Oct. 14, 1992

[51] Int. Cl.$^5$ ............................................. H05K 7/10
[52] U.S. Cl. .................................. 361/684; 361/785; 439/65; 439/79; 439/540
[58] Field of Search .................... 439/65, 76, 79, 540; 235/441; 361/395, 399, 413, 679–686, 790, 796, 803, 785; 364/708, 708.1

[56] References Cited

U.S. PATENT DOCUMENTS 5,057,971  10/1991  Hautvast et al. ..................... 361/395

*Primary Examiner*—Leo P. Picard
*Assistant Examiner*—Michael W. Phillips
*Attorney, Agent, or Firm*—Bacon & Thomas

[57] ABSTRACT

A read/write unit for an integrated circuit card adapted to receive two integrated circuit cards includes a housing formed with a first aperture and a second aperture for receiving two integrated circuit floppy diskettes respectively. A main board is situated in the housing and has an L-shape female connector at an end side nearer to the apertures of the housing. A first secondary board a situated in the housing and has an L-shape male connector at an end side for connecting the L-shape female connector of the main board, an upstanding female connector in a position adjacent to the L-shape male connector, and a first seat matchable with the first aperture of the housing on an external end side for receiving an integrated circuit card. A second secondary board is situated in the housing a certain distance from a base panel of the housing and has a downward extending male connector at an end side for connecting the upstanding female connector of the first secondary board, a second seat matchable with the second aperture of the housing at an external end side for receiving another integrated circuit card.

6 Claims, 2 Drawing Sheets

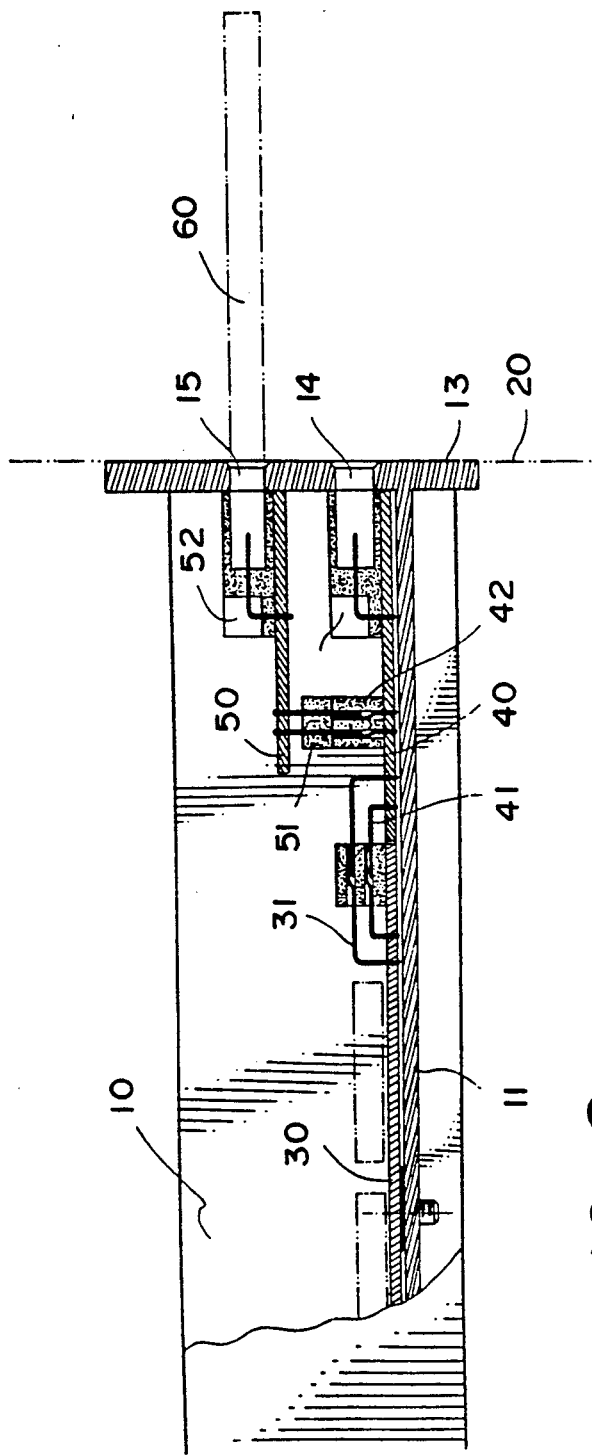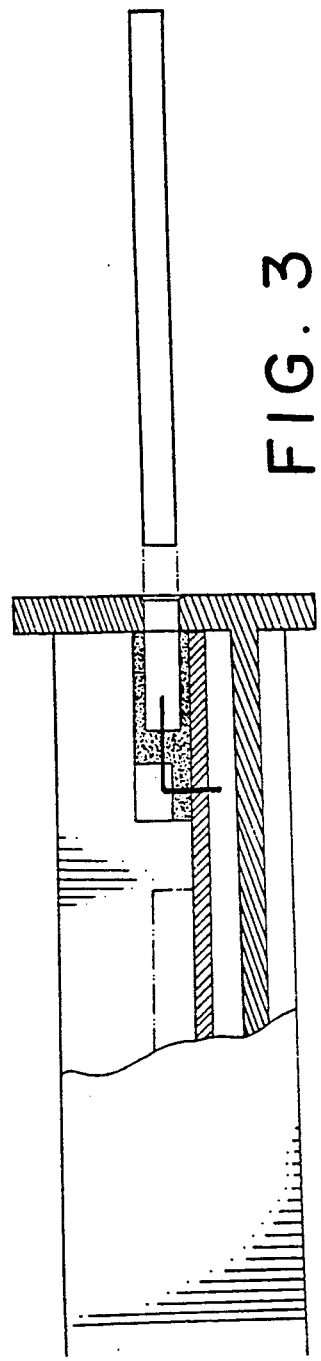

READ/WRITE UNIT FOR TWO INTEGRATED CIRCUIT CARDS

FIELD OF THE INVENTION

The present invention relates generally to an integrated circuit (IC) card read/write unit, and more particularly, to an IC read/write unit which is adapted to receive at least two IC cards.

BACKGROUND OF THE INVENTION

Rapid development has been observed in the field of computer peripheral devices. A variety of read/write media and associated read/write unit have been developed, including tapes and tape drives, floppy disks and floppy disk drives, hard disks and hard disk drives, as well as the latest IC cards and IC read/write units. The aim of development of these media is usually to decrease their size and at the same time increase their memory capacity. The latest IC card is desirable because of its light weight, small dimensions and consequent retractability, replaceability, and portability, despite a large memory size nearly equivalent to that of a hard disk.

A problem is that conventional IC drives are adapted to receive only one IC card. To receive two IC cards, a computer or personal computer would normally require two IC read/write units. The most readily envisaged configuration would be to have each IC read/write unit occupy a specific amount of space, in which case the space occupied by two IC read/write units would be twice the space occupied by one IC read/write unit. To reduce the size of the computer or personal computer, it would instead be desirable to provide an IC drive which is adapted to receive more than one IC card.

SUMMARY OF THE INVENTION

It is therefore a primary object of the present invention to provide an IC read/write unit which is adapted to receive two IC cards.

Another object of the present invention is to provide an IC read/write unit, with which the size of a computer or personal computer can be reduced.

These and other objects of the present invention will be apparent to those skilled in the art upon reading the detailed description hereinbelow, with appropriate reference to the accompanying drawings.

BRIEF DESCRIPTION OF THE DRAWINGS

FIG. 2 is a cross-sectional view of the IC read/write unit of the present invention; and FIG. 3 is a cross-sectional view of a conventional read/write unit.

DETAILED DESCRIPTION OF THE PREFERRED EMBODIMENT

Figure 1:
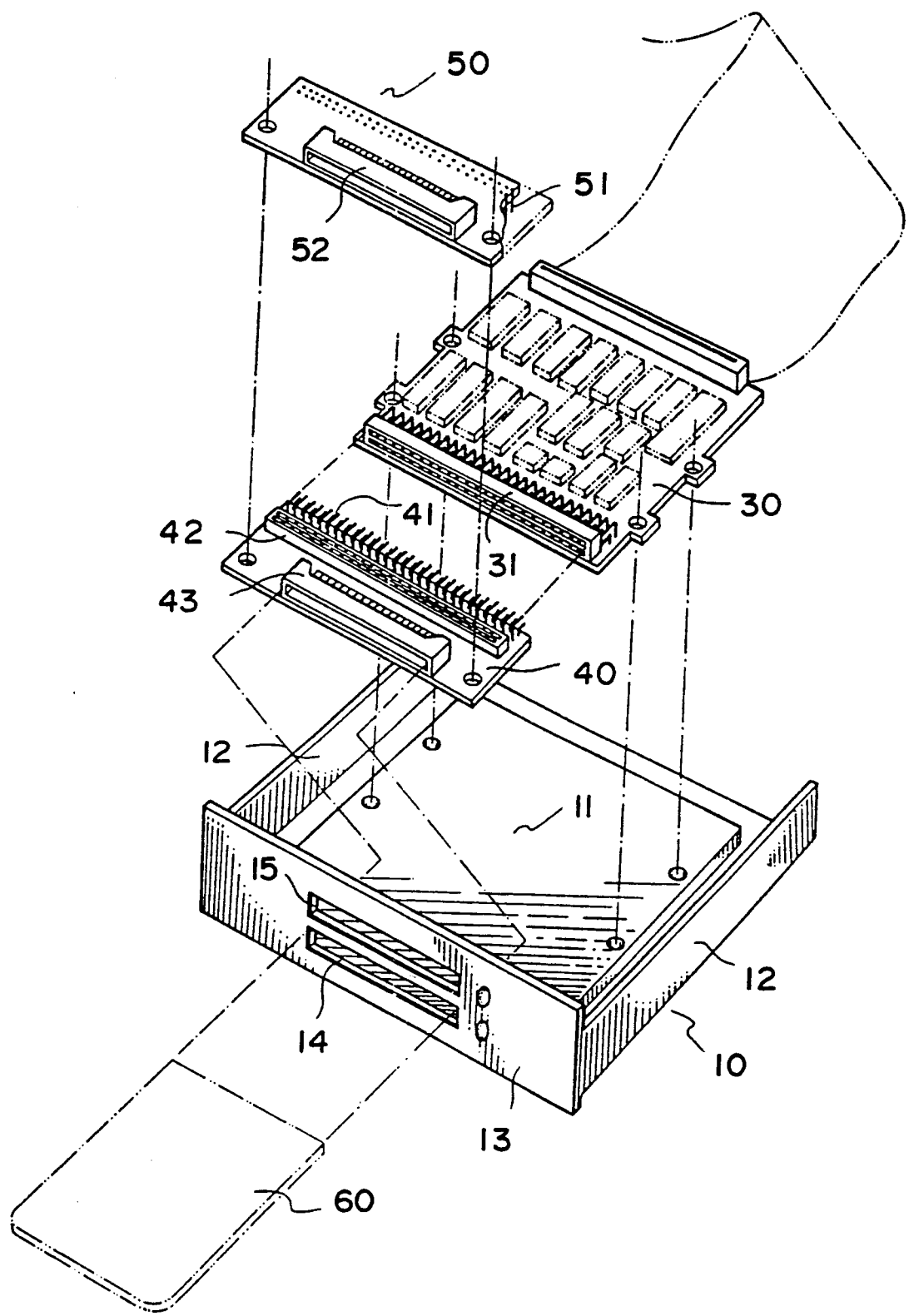
FIG. 1 is an exploded view of an IC read/write unit in accordance with the present invention.

Referring to FIGS. 1 and 2, it can be seen that the IC read/write unit of the present invention includes a housing 10 having two apertures 14 and 15 installed in a main frame or main body 20 of a computer (partially shown in dotted line in FIG. 2), a main board 30 situated in the housing 10, a first secondary board 40 connected to the main board 30, and a second secondary board 50 connected to the first secondary board 40. With the combination described hereinbelow, the IC read/write unit of the present invention is adapted to receive two IC cards, in which the first secondary board 40 contacts an IC card through the first aperture 14 and the second secondary board 50 contacts another IC card through the second aperture 15.

Similar to the conventional housing of the IC read/write unit shown in FIG. 3, the housing 10 of the preferred IC read/write unit is in a cartridge shape. In particular, the housing 10 is composed of a base panel 11, two upstanding lateral side panels 12, and an upstanding covering panel 13 which will be exposed to the users after installation of the computer. However, totally different from the conventional IC read/write unit housing, the housing 10 of the IC read/write unit of the present invention is formed at its covering panel 13 with two apertures: a first aperture 14 at a lower position and a second aperture 15 at an upper position, both for receiving IC cards 60 (shown in dotted line in FIG. 2). As can be seen in the drawings, the first aperture 14 and the second aperture 15 are in vertical alignment with each other.

The main board 30 is fixed on the base panel 11 of the housing 10 by any conventional fastening means such as screws or the like. A first connecting means 31, for example a female connector, in this case an L-shaped header pin holder, is provided on the main board 30 at an end side nearer to the card apertures 14 and 15.

The first secondary board 40 is fixed on the base panel 11 of the housing 10 by means of connection to the main board 30. A second connecting means 41, for example a male connector, in this case an L-shaped header pin, is provided on the first secondary board 40 at an end side thereof corresponding to the position of the first connecting means 31 of the main board 30 so as to be connectable therewith. The first secondary board 40 is connectable to the main board 30 due to the connection between the first connecting means 31 and the second connecting means 41. The first secondary board 40 is further provided with a third connecting means 42, for example a female connector, in this case an upstanding header pin holder, in a position adjacent to the second connecting means 41. The first secondary board 40 is further provided with a first seat 43 aligned with the first aperture 14 at an external end side thereof for receiving an IC card 60 through the first aperture 14 of the housing 10 and which includes a connector for electrically connecting IC circuits on an IC card to circuits on the first secondary board 40.

The second secondary board 50 is situated in the housing 10, a distance from the base panel 11 of the housing 10, by any conventional fastening means such as screws or the like (not shown) provided on the lateral side panels 12 of the housing 10. The second secondary board 50 is provided with a fourth connecting means 51, for example a downwardly extending male connector, in this case a downwardly extending header pin, at an end side thereof which is connectable with the third connecting means 42 of the first secondary board 40. The second secondary board 50 is also provided with a second seat 52 aligned with the second aperture 15 at an external end side thereof for receiving another IC card 60 through the second aperture 15 of the housing 10 and which includes a connector for electrically connecting IC circuits on IC card 60 to circuits on second secondary board 50.

While the present invention has been explained in relation to its preferred embodiment, it is to be understood that various modifications thereof will be apparent to those skilled in the art upon reading this specification. The invention disclosed herein is therefore intended to cover all such modifications as fall within the scope of the appended claims.

I claim:

1. An integrated circuit read/write unit comprising:
   (a) a housing installed in a main body of a computer, said housing being formed at a covering panel thereof with a first aperture and a second aperture both for receiving integrated circuit cards;
   (b) a main board having two end sides, one of which is closer than the other to said first and second apertures, said main board being situated in said housing and having a first connecting means at said end side of the main board which is closer to said first and second apertures;
   (c) a first secondary board situated in said housing and having a second connecting means at an end side thereof, a third connecting means in a position adjacent to said second connecting means, and a first seat aligned with said first aperture of said housing at an external end side thereof for receiving a first integrated circuit card; and
   (d) a second secondary board situated in said housing a certain distance from a base panel of said housing and having a fourth connecting means at an end side thereof, and a second seat aligned with said second aperture of said housing at an external end side thereof for receiving a second integrated circuit card, wherein said first and second connecting means are for electrically connecting circuits on said main board with circuits on said first secondary board, and said third and fourth connecting means are for electrically connecting circuits on said first secondary board with circuits on said second secondary board.

2. An integrated read/write unit as set forth in claim 1, wherein said first aperture and said second aperture are in vertical alignment with each other.

3. An integrated read/write unit as set forth in claim 1, wherein said first connecting means is a female connector and said second connecting means is a male connector.

4. An integrated read/write unit as set forth in claim 3, wherein said female connector is an L-shaped header pin holder and said male connector is an L-shaped header pin.

5. An integrated read/write unit as set forth in claim 1, wherein said third connecting means is a female connector and said fourth connecting means is a male connector.

6. An integrated read/write unit as set forth in claim 5, wherein said female connector is an upstanding header pin holder and said male connector is a downwardly extending header pin.

* * * * *